United States Patent
Disney

(10) Patent No.: US 8,704,292 B2
(45) Date of Patent: Apr. 22, 2014

(54) VERTICAL CAPACITIVE DEPLETION FIELD EFFECT TRANSISTOR

(76) Inventor: Donald R. Disney, Cupertino, CA (US)

(*) Notice: Subject to any disclaimer, the term of this patent is extended or adjusted under 35 U.S.C. 154(b) by 330 days.

(21) Appl. No.: 12/710,968

(22) Filed: Feb. 23, 2010

(65) Prior Publication Data

US 2011/0204435 A1 Aug. 25, 2011

(51) Int. Cl.
*H01L 29/66* (2006.01)

(52) U.S. Cl.
USPC .......... 257/329; 257/337; 257/E29.257; 257/E27.06

(58) Field of Classification Search
USPC .......... 257/329, 337, E29.257, E27.06
See application file for complete search history.

(56) References Cited

U.S. PATENT DOCUMENTS

| 2005/0167749 A1* | 8/2005 | Disney | 257/341 |
| 2008/0290405 A1* | 11/2008 | Lu | 257/330 |
| 2010/0084706 A1* | 4/2010 | Kocon | 257/330 |

* cited by examiner

*Primary Examiner* — Elias M Ullah
(74) *Attorney, Agent, or Firm* — Perkins Coie LLP

(57) ABSTRACT

Vertical capacitive depletion field effect transistors (VCDFETs) and methods for fabricating VCDFETs are disclosed. An example VCDFET includes one or more interleaved drift and gate regions. The gate region(s) may be configured to capacitively deplete the drift region(s) though one or more insulators that separate the gate region(s) from the drift region(s). The drift region(s) may have graded/non-uniform doping profiles. In addition, one or more ohmic and/or Schottky contacts may be configured to couple one or more source electrodes to the drift region(s).

20 Claims, 9 Drawing Sheets

VERTICAL CAPACITIVE DEPLETION FIELD EFFECT TRANSISTOR

TECHNICAL FIELD

The present disclosure is directed to semiconductor devices and processes, for example, to power transistors and to the fabrication of power transistors.

BACKGROUND

Power transistors (e.g., metal oxide semiconductor field effect transistors (MOSFETs), insulated gate bipolar transistors (IGBTs), superjunction MOSFETs, vertical metal oxide semiconductor (VMOS) transistors, vertical double-diffused metal oxide semiconductor (VDMOS) transistors, bipolar junction transistors, etc.) are often characterized by a number of device characteristics. For example, a relatively high breakdown voltage (BV), a relatively low on-resistance ($R_{ON}$), a relatively large safe operating area (SOA), and/or the like are generally desirable.

In power transistors, there is typically a trade-off between high BV and low $R_{ON}$ characteristics. For example, BV and $R_{ON}$ characteristics both typically increase as dopant concentration in a transistor's drift regions decrease or the thickness of the drift regions increase. In certain transistors, such as over-current protection transistors, over-voltage protection transistors, power supply switching transistors, normally on transistors, depletion mode transistors, performance transistors, etc., BV and $R_{ON}$ characteristics may be particularly important. For example, it may be beneficial for such transistors to have BV characteristics sufficient to block excess voltage during an over-voltage condition and to have low $R_{ON}$ such that little power is dissipated by the transistor.

Further, relatively low cost and relatively high yield are also generally desirable attributes for fabrication of a transistor. In many cases, costs increase and yields decrease as transistor fabrication becomes more complex. Some of the many factors leading to fabrication complexity include the number of processes employed (e.g., deposition, diffusion, etching, masking, etc.), tolerances for employed processes, and/or the like.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale and do not necessarily portray actual angles, lines, surfaces, shapes, dimensions, and/or the like. Likewise, the relative sizes of elements illustrated by the drawings may differ from the relative size depicted. For example, the drawings may illustrate idealized devices with straight lines and square corners. One skilled in the relevant art recognizes that actual devices vary based upon fabrication tolerances, layout considerations, material properties, and/or the like.

For a better understanding of the present invention, reference will be made to the following Detailed Description, which is to be read in association with the accompanying drawings, wherein.

DETAILED DESCRIPTION

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. It is intended that the terminology used in the description presented below be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section. Likewise, terms used to describe a position or location, such as "under," "below," "over," "above," "right," "left," and similar terms, are used relative to the orientation of the illustrated embodiments and are intended to encompass similar structures when rotated into the illustrated orientation. The term "based on" or "based upon" is not exclusive and is equivalent to the term "based, at least in part, on" and includes being based on additional factors, some of which are not described herein. References in the singular are made merely for clarity of reading and include plural references unless plural references are specifically excluded. The term "or" is an inclusive "or" operator and is equivalent to the term "and/or" unless specifically indicated otherwise. In the description that follows, the scope of the term "some embodiments" is not to be so limited as to mean more than one embodiment, but rather, the scope may include one embodiment, more than one embodiment, or perhaps all embodiments. Although illustrated with respect to vertical MOSFETs, the technology described herein may also be applicable to other power transistors, other planer gate transistors, lateral power transistors, N-channel transistors, P-channel transistors, lateral semiconductor transistors, insulated gate bipolar transistors, bipolar junction transistors, enhancement mode transistors, and/or the like. Likewise, the disclosed technology may be also applicable to other semiconductor and nonsemiconductor materials and/or semiconductor types. For example, the technology is discussed herein with reference to certain features formed on N-type substrates. However, suitable transistors may also be formed on P-type substrates, other disclosed features may be formed of different materials, other dopings may be employed, and/or the like. Likewise, certain embodiments are described below as having certain characteristics (e.g., dimensions, geometries, concentrations, etc.). The discussed characteristics are merely examples of suitable characteristics, and any other suitable characteristics may be employed.

Figure 1:
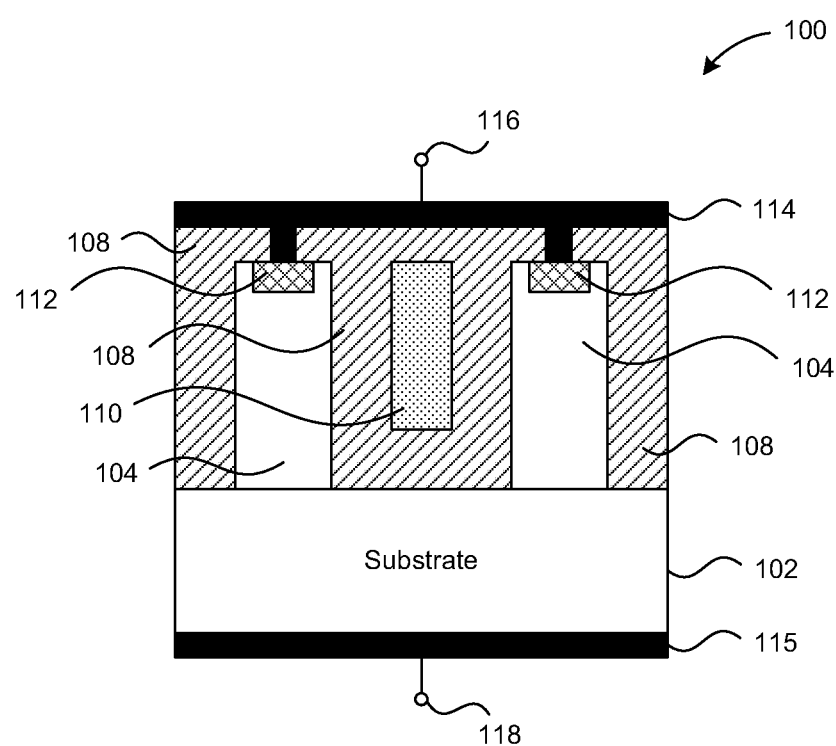
FIG. 1 is a cross-sectional view of an embodiment of a vertical capacitive depletion field effect transistor (VCDFET)

FIG. 1 is a cross-sectional view of vertical capacitive depletion field effect transistor (VCDFET) 100. As shown, VCDFET 100 includes substrate 102, drift regions 104, insulator 108, gate region 110, source contact regions 112, source metallization 114, drain metallization 115, source electrode 116, and drain electrode 118. In one embodiment, substrate 102, drift regions 104, source contact regions 112, source metallization 114, and drain metallization 115 are configured to provide a current path between source electrode 116 and drain electrode 118 that may be controlled by capacitive depletion or capacitive enhancement from gate region 110 through insulator 108, for example, in response to application of a second voltage across drain electrode 118 and gate region 110. In one embodiment, drift regions 104 may also be configured to selectively enable a current to flow from source electrode 116 to drain electrode 118, for example, in response to application of a voltage across drain electrode 118 and source electrode 116. In these and other example, the magnitude of enabled current through drift regions 104 may be based on the voltage applied across drain electrode 118 and gate region 110.

By employing structural features such as the interleaving of gate region 110 with drift regions 104, the use of heavier than typical drift region doping may be employed. Such doping may also enable higher than average drift region conductivity and hence a lower than typical on-resistance ($R_{ON}$) for a given breakdown voltage (BV). Based on these and other features, VCDFET 100 may require fewer than typical fabrication processes, may have lower than typical losses (e.g., ohmic loses, diode drops, capacitive losses, and/or the like), greater than typical frequency response characteristics, lower than typical $R_{ON}$ for a given BV, and/or the like.

In addition, VCDFET 100 may also feature a direct, constant, continuous, unswitched, static, invariable, and/or like path or connection between source electrode 116 and drift regions 104. VCDFET 100 may also have a linearly proportional current/voltage relationship between drain electrode 118 and source electrode 116 when the voltage across drain electrode 118 and gate region 110 is lower than a pinch-off voltage. In this example, the current/voltage relationship between drain electrode 118 and source electrode 116 may be substantially constant at an upper current magnitude when the voltage across drain electrode 118 and gate region 110 is greater than the pinch-off voltage.

Further details regarding substrate 102, drift regions 104, insulator 108, gate region 110, source contact regions 112, source metallization 114, and drain metallization 115 are discussed in conjunction with FIGS. 2A-2I.

In one embodiment, VCDFET 100 may be employed as a normally on transistor configured to provide over-voltage/over-current protection to an electrical circuit. As a specific example, VCDFET 100 may be employed in series with a switched-mode power supply and between the switched-mode power supply and an input source for the switched-mode power supply to limit voltage and/or current applied to the input of the switched-mode power supply. However, VCDFET 100 may also be configured to provide any suitable functionality with or in a switched-mode power supply or any other suitable circuit.

Although illustrated as a single-cell transistor, VCDFET 100 may alternately be a multi-cell transistor of any suitable configuration. In such transistors, each of the cells may also be coupled to shared substrates, gate metallizations, drain metallizations, source metallizations, and/or the like. Further details regarding multi-cell VCDFETs are discussed below in conjunction with FIGS. 3 and 4.

FIGS. 2A-2I illustrate an example of a method for fabricating VCDFET 100 of FIG. 1. As one example, the described process may be a relatively simple and/or low-cost fabrication process. For example, at least one example process may be completed with only three masking steps.

Figure 2A:
FIGS. 2A-2I illustrate a method of fabricating the VCDFET of FIG. 1 according to an embodiment of the invention.

Starting with FIG. 2A, the process begins with substrate 102 of a first semiconductive type. As one example, substrate 102 may be an N-type substrate having a doping concentration substantially between $1\times10^{18}$ cm$^{-3}$ and $1\times10^{20}$ cm$^{-3}$ and a thickness substantially between 100 and 600 microns. However, any suitable substrate may be employed.

Figure 2B:
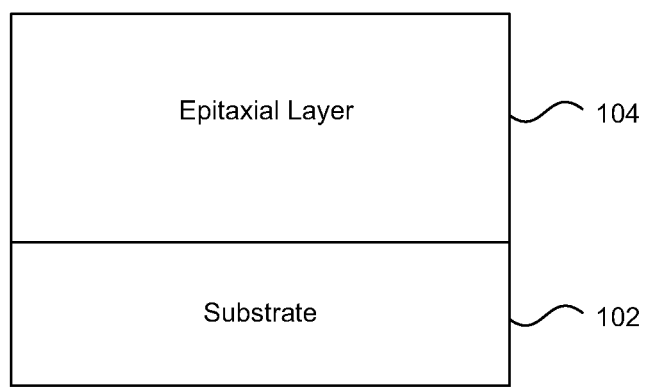

With reference to FIG. 2B, drift region 104 is then formed on substrate 102. In one embodiment, drift region 104 is an epitaxial layer having a graded doping profile as discussed in further detail with respect to FIG. 5. In one embodiment, drift region 104 includes N-epitaxial silicon formed while concentrations of dopant gases or other impurities in proximity to substrate 102 are altered as a function of time more or less continuously or variably to form a graded doping profile (e.g., a specified graded concentration profile, whether linear, piecewise linear, non-linear, or otherwise varying, etc). However, any other suitable materials, processes, and/or the like may be employed to form drift region 104.

Although drift region 104 is described herein as being formed onto substrate 102, other fabrication processes may begin with a preformed dual-layer substrate that includes substrate 102 and drift region 104.

Figure 2C:
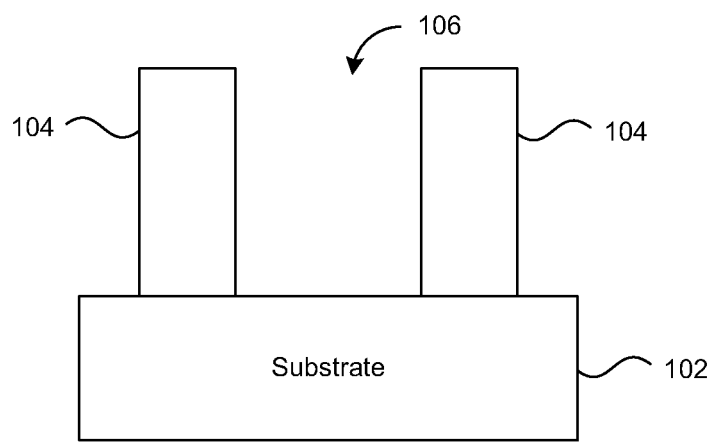

Continuing now to FIG. 2C, trenches 106 are then formed into drift regions 104 from the top surfaces by any suitable process (e.g., reactive ion etching, wet chemical etching, anisotropic dielectric etching, etc.).

In one embodiment, trenches 106 are etched just through drift regions 104 to expose but not etch substrate 102. However, some embodiments are able to tolerate process variations (e.g., overetching, underetching, etc.) with little or no effect on resulting transistor performance. For example, the later formation of insulator 108 into trenches 106 may reduce or eliminate the effects of such process variations. In one embodiment, the extension of trenches 106 into substrate 102 has less effect on resulting performance than having trenches not completely extending through drift regions 104. For example, if trenches 106 do not extend completely through drift regions 104, the BV of the resulting transistor may be adversely limited. Accordingly, it may be beneficial to bias the etching of trenches 106 such that slight overetching is expected. For example, if 20-micron-deep trenches are to be formed in 20-micron-deep drift regions by a process having a 10-percent variation, the process may advantageously be configured to etch 22-micron-deep trenches so that even if the resulting trenches are only 20 microns deep (e.g., 10-percent shallow) then the trenches will still extend through the drift regions. However, if etching results in 24-micron-deep trenches, little or no performance degradation may be expected. In one embodiment, trench 106 has a width of between about 3 microns and about 8 microns.

Figure 2D:
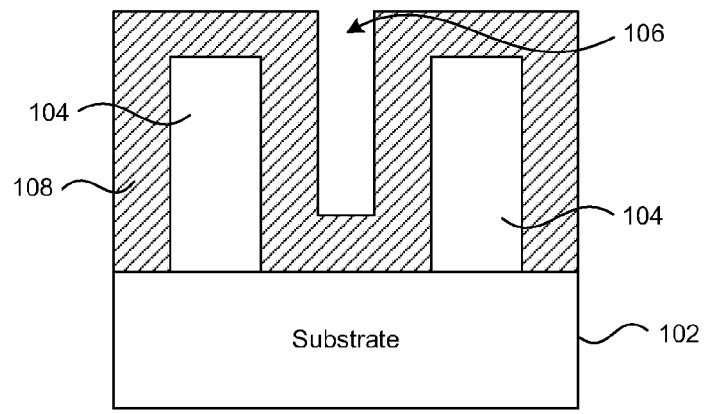

With reference to FIG. 2D, insulator 108 may then be formed on the bottom surface and side wall surfaces of trenches 106 from any suitable material of any suitable thickness. As one example, the thickness of insulator 108 may be enough to enable a desired BV, but not so thick as to hamper desired controllability of the conductivity of drift regions 104 via gate region 110.

In some embodiments, insulator 108 may include silicon dioxide, silicon nitride, and/or any other suitable dielectrics, oxides, or other insulative materials. In one embodiment, insulator 108 is thermally grown, while in another embodiment, insulator 108 is deposited (e.g., via a chemical vapor deposition (CVD) process, etc.). In yet another embodiment, insulator 108 may be partially grown and partially deposited, which may, for example, enable formation of insulator 108 in substantial conformity with trenches 106. As one example of a partial deposition and partial growth process, about 0.5 to 1 micron of insulation may be grown and additional insulation may be deposited to result in a finished thickness of about 1 to 3 microns. In other examples, insulator 108 may have a thickness of between about 0.2 microns and about 4 microns.

Figure 2E:
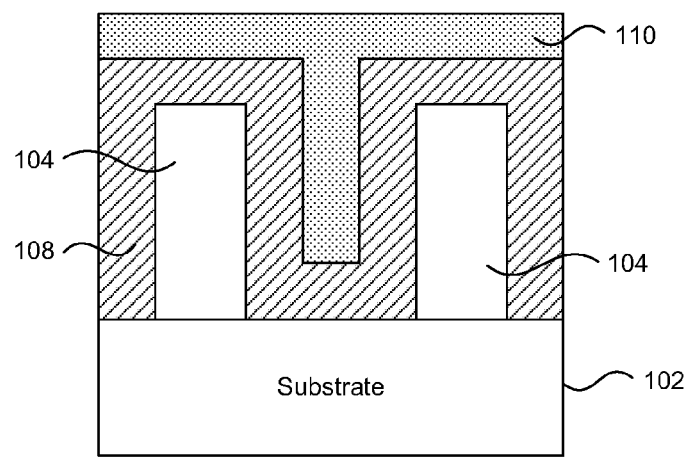

Referring now to FIG. 2E, conductive material is then deposited or otherwise formed into trenches 106 to form gate region 110. As shown, gate region 110 is separated from the trench sidewall surfaces and trench bottom surface by insulation 108. While gate region 110 may include virtually any conductive material, as one example, gate region 110 may be formed from doped polysilicon.

Figure 2F:
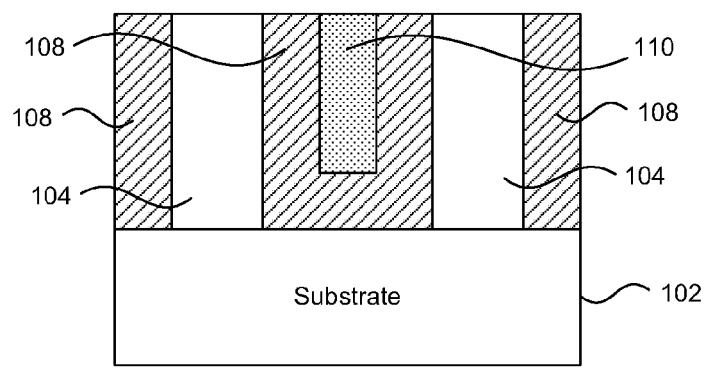

Continuing to FIG. 2F, the surface of the structure of FIG. 2E may then be planarized, for example, to remove excess conductive material and/or to make the top surfaces of drift regions 104, insulator 108, and gate region 110 substantially coplanar. Planarization may include use of an etching process, an etch-back process, a chemical mechanical polishing (CMP) process, and/or the like and/or combinations thereof. As one example, planarization may include an etch-back process followed by a CMP process.

Figure 2G:
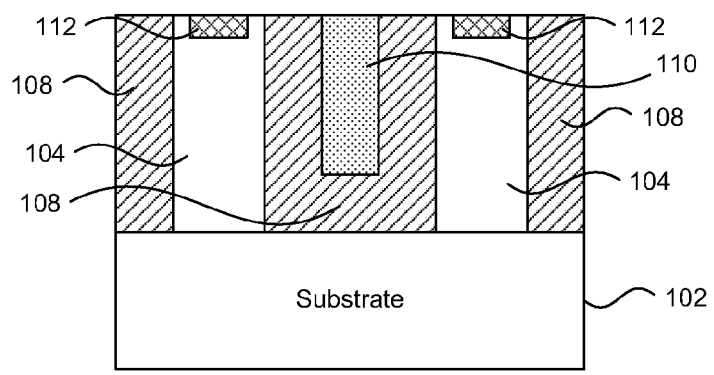

As shown in FIG. 2G, source contact regions 112 may then be formed. As one example, source contact regions 112 are formed as implanted regions that are the same conductivity type as, and more conductive than, drift regions 104. To provide additional examples, source contact regions 112 may include N+ dopings of phosphorous, arsenic, antimony, and/or the like. Formation of source contact regions 112 may further include diffusion of doping materials into drift regions 104.

In the embodiment of FIG. 2G, a masking step is employed in forming source contact regions 112, for example, to provide a separation between source contact regions 112 and gate region 110. This separation may enable greater than typical suppression of off-state leakage currents and/or increased depletion of drift regions 104 by gate region 110. In other embodiments, no masking is employed and the source contact regions may be formed by a blanket (i.e. unmasked) implantation step, which may, for example, lower process cost by avoiding one masking step. Further, there may be little or no detrimental effects of employing blanket implantation as typical dopants for source contact regions 112 generally have little or no effect on exposed portions of insulator 108 and gate region 110.

Figure 2H:
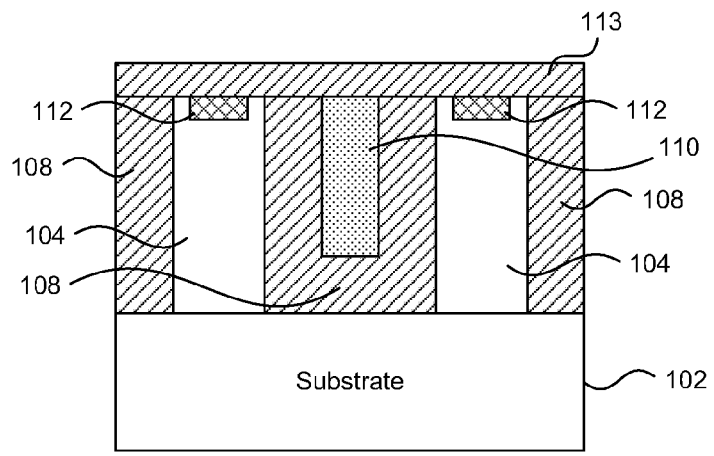

With reference now to FIG. 2H, layer 113 of insulative material may then be formed over the surface of the structure of FIG. 2G, including over any exposed drift regions 104, insulator 108, gate region 110, source contact regions 112, and/or portions thereof. Any suitable processes and/or materials, including those discussed above in conjunction with FIG. 2D, may be employed.

Although layer 113 is illustrated as separate from insulator 108 of FIG. 2D, layer 113 may be either unitary with or separate from insulator 108.

Figure 2I:
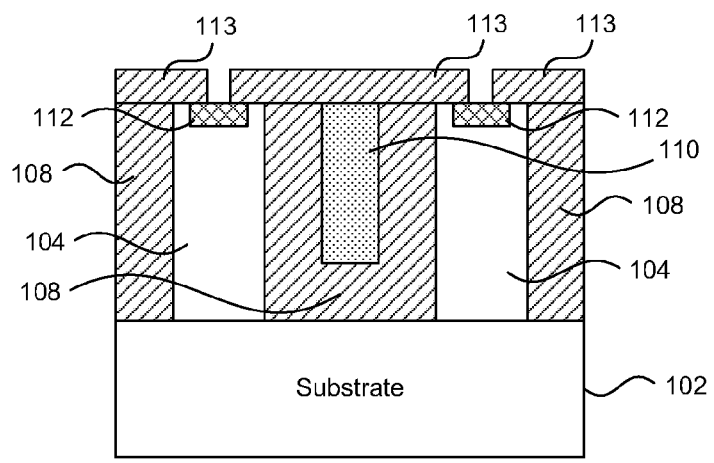

Continuing now to FIG. 2I, openings are formed into layer 113 to enable connections to gate region 110 and source contact regions 112. For example, layer 113 may be etched or otherwise processed to form contact openings through layer 113 to source contact regions 112 and separately to gate region 110. Contact openings to gate region 110 are not shown. In one embodiment, they are formed at another location along a line extending into the page of this drawing.

Following formation of the openings, source metallization 114 may be deposited or otherwise formed, for example, to fabricate source electrode 116 as shown in FIG. 1. Although not shown in FIG. 1, a gate metallization may also be deposited or otherwise formed, for example, to fabricate a gate electrode. An optional drain metallization 115 may also be formed, for example, to fabricate drain electrode 118 as shown in FIG. 1. Substrate 102 may be also optionally reduced in thickness before formation of drain metallization 115. As one example, a substrate may be thinned to a thickness or depth sufficient to provide sufficient mechanical strength while enabling use of smaller packaging and/or reduction of $R_{ON}$. For example, the amount that substrate 102 is thinned may be based on a wafer strength needed for wafer processing, a design characteristic for device rigidity, a designed $R_{ON}$, and/or the like. In one embodiment, a thinned substrate may have a thickness of between about 100 microns and 400 microns as compared to a starting thickness of between about 600 microns and 900 microns. However, any suitable thicknesses may be employed for either finished and/or starting thicknesses. Passivation layers (not shown) may also be optionally formed.

As one example, a VCDFET having a 200-volt BV, a trench depth of between about 15 microns and about 20 microns, a drift region width of between about 1 micron and about 2 microns, an insulator wall width of between about 1 micron and about 2 microns, and a gate region width of between about 1 micron and about 2 microns may be suitably employed.

Figure 3:
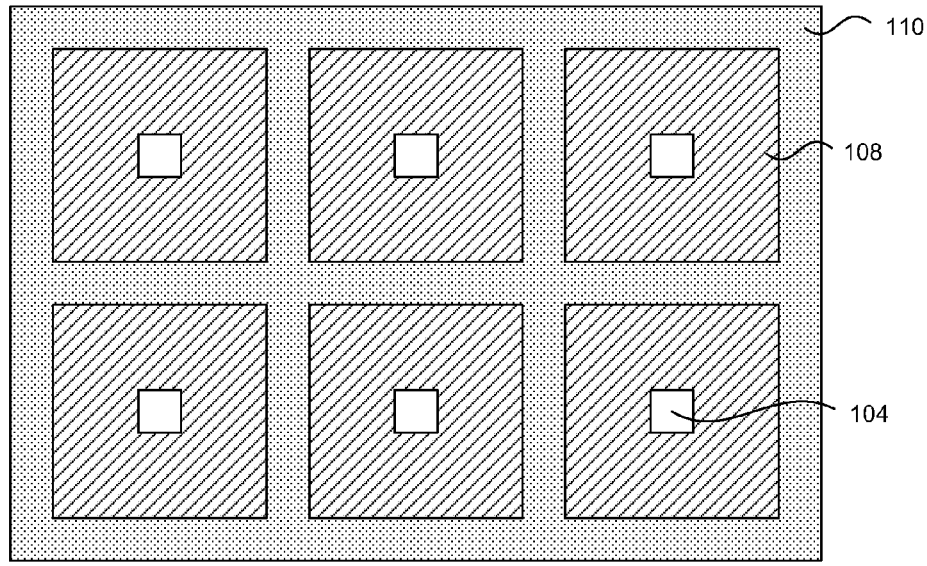
FIGS. 3 and 4 are plan views of embodiments of VCDFETs.
Figure 4:
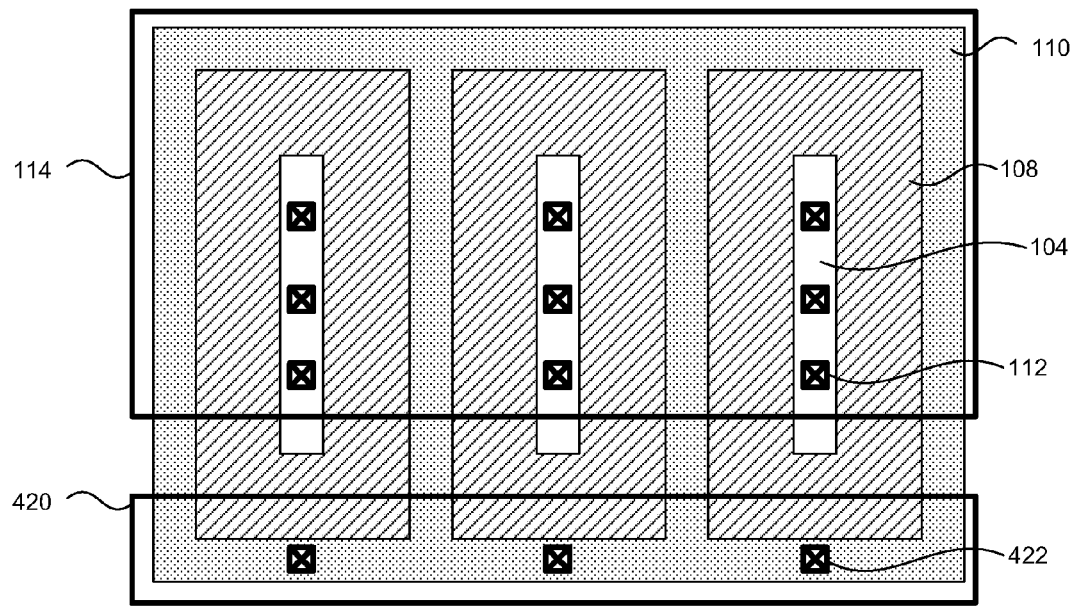

FIGS. 3 and 4 are plan views of embodiments of VCDFETs according to aspects of the invention.

FIGS. 3 and 4 illustrate two examples of surface structures of arrays of VCDFET cells. In the example of FIG. 3, six cells are illustrated in a 2 cell×3 cell array pattern, while in the example of FIG. 4, three cells in a 1 cell×3 cell array pattern are illustrated. Although two specific examples are illustrated herein, any suitable arrangements of cells, transistors, arrays, configurations, geometries, and/or the like may be employed. Further, multiple arrays may be electrically coupled together to achieve desired transistor characteristics, protection features, other operational features, and/or the like. As shown in FIGS. 3 and 4, that gate region 110 may completely surround insulator 108, and insulator 108 may completely surround drift regions 104, such that drift regions 104 may be more easily depleted by gate region 110. FIG. 4 further illustrates plan view outlines of source contact regions 112, source metallization 114, gate metallization 420, and gate contact regions 422.

Figure 5:
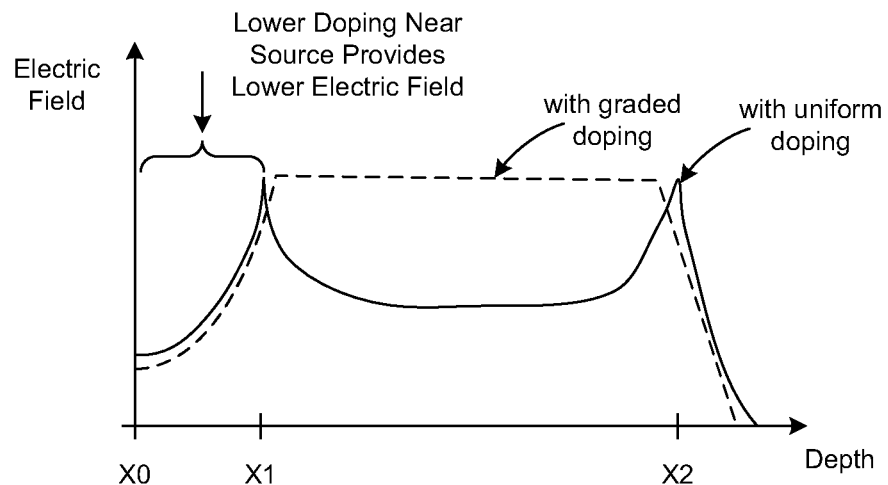
FIG. 5 illustrates an electric field distribution along the vertical length of drift regions of an embodiment of a VCDFET.

FIG. 5 illustrates an electric field versus depth relationship for two drift region doping profiles according to aspects of the invention. In FIG. 5, depth X0 approximately corresponds to the bottom of a source contact region, depth X2 approximately corresponds to a transition between a substrate and a drift region, and depth X1 is between depth X0 and depth X2, i.e. somewhere along the vertical height of the drift region.

As illustrated by FIG. 5, non-uniform drift region doping may be employed in some embodiments of the invention. For example, a graded doping profile having an increasing dopant concentration approaching the substrate and a decreasing dopant concentration toward the source contact region may be suitably employed, e.g., to provide increased electric field uniformity. Further, increased electric field uniformity in the drift region may also enable an increased BV for a given drift region depth.

In an example drift region doping, a linearly graded doping profile having a lower dopant concentration near the top of the drift region and a higher dopant concentration near the bottom of the drift region may be employed. For example, for a transistor having a 200-volt BV, the doping may be about $5\times10^{15}$ cm-3 at depth X1, about $5\times10^{16}$ cm-3 at depth X2, and linearly graded in between. Such a graded doping profile, in combination with the capacitive depletion effect of the gate and insulator regions, may provide a substantially uniform electric field within the drift region. The solid line in FIG. 5 shows a hypothetical electric field distribution in the case of a uniformly doped drift region. High electric field peaks at the top and bottom of the drift region may limit the BV in this case. The dashed line in FIG. 5 shows a uniform electric field distribution associated with an example drift region doping profile.

In some embodiments, a doping profile may be employed between depth X0 and depth X1 that has a uniform doping or a doping gradient that is substantially different from that of the region between X1 and X2. For example, the region between X0 and X1 may have a substantially uniform dopant concentration that is lower than the range of doping concentrations employed between depth X1 and depth X2. Moreover, the dopant concentration between X0 and X1 may be selected to enable pinch-off of the drift region at relatively low voltages (e.g., full drift region depletion at, for example, 5 to 10 volts), to improve a safe operating area (SOA) of the transistor, to reduce impact ionization, and/or the like. By way of a specific example, the dopant concentration between depth X0 and depth X1 may be between $1\times10^{14}$ cm×3 and $5\times10^{15}$ cm-3.

Figure 6:
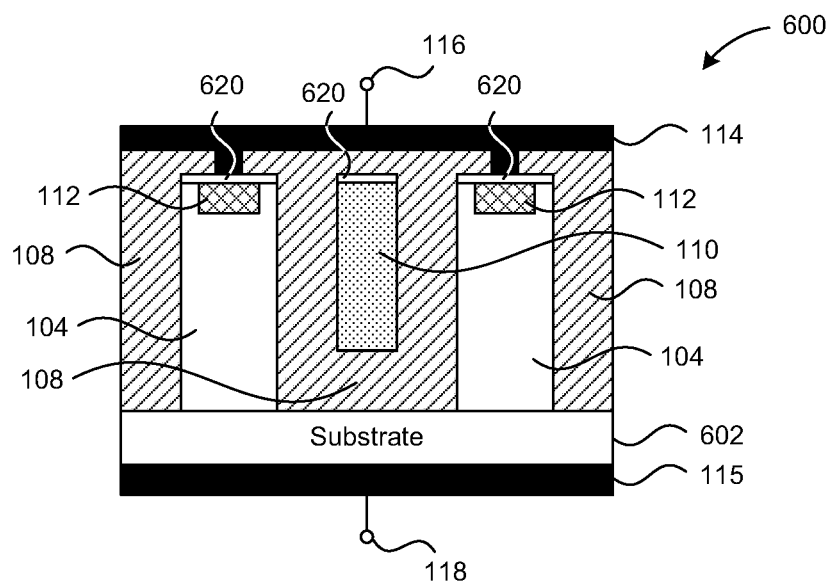
FIG. 6 is a cross-sectional view of another embodiment of a VCDFET.

FIG. 6 is a cross-sectional view of VCDFET 600. In addition to certain features discussed in conjunction with VCD-FET 100 of FIG. 1, VCDFET 600 includes silicide 620 which may be included on any or all of drift regions 104, gate region 110, source contact regions 112, and/or portions thereof. For example, silicide 620 may be employed to further lower gate and/or source resistances for VCDFET 600 as compared to VCDFET 100. FIG. 6 also illustrates thinned substrate 602 as an example of the thinned substrates discussed above with respect to FIG. 2I.

Figure 7A:
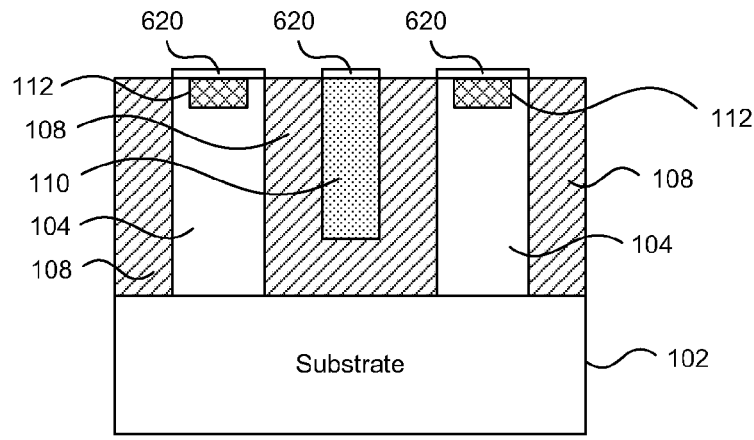
FIGS. 7A-7C illustrate aspects of a method for fabricating the VCDFET of FIG. 6 according to an embodiment of the invention.
Figure 7B:
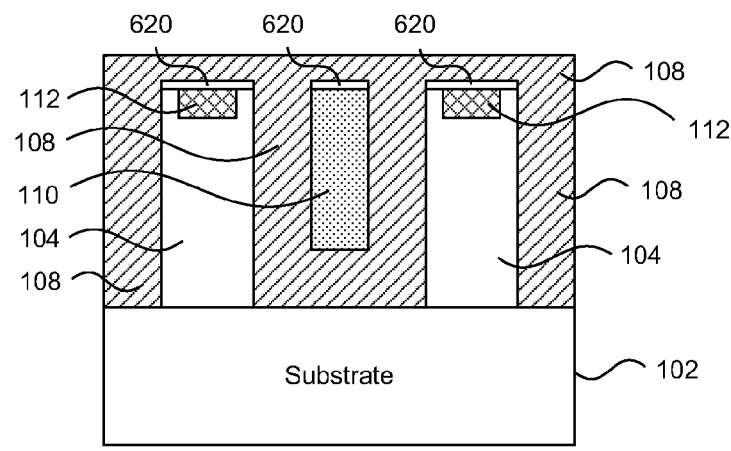
Figure 7C:
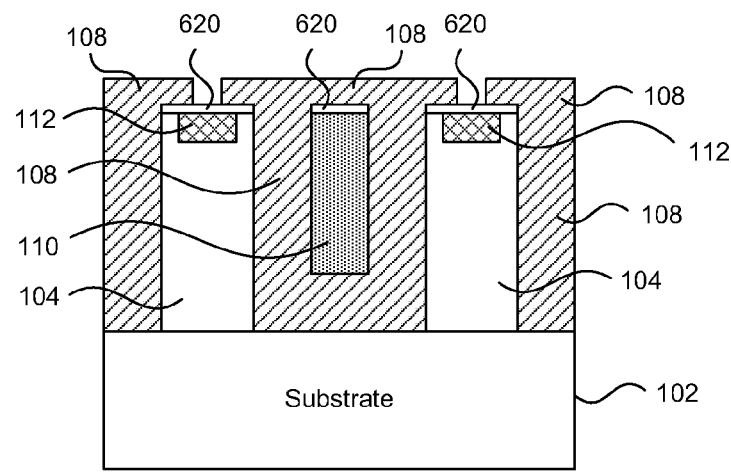

FIGS. 7A-7C illustrate an example of a method for fabricating VCDFET 600 of FIG. 6.

Following the formation of source contact regions 112 as discussed in conjunction with FIG. 2G, silicide 620 may be formed onto any or all of drift regions 104, gate region 110, source contact regions 112, and/or portions thereof. As one example, silicide 620 may be formed by salicidation or other processes similar to, or described by, U.S. patent application Ser. No. 12/557,841, POWER DEVICE WITH SELF-ALIGNED SILICIDE CONTACT, filed on Sep. 11, 2009, and having inventors Donald Ray Disney and Ognjen Milic. The contents of this afore-mentioned application are hereby incorporated by reference.

Following formation of silicide 620, an insulative layer may be formed over the exposed features, and contact openings may be formed into the insulative layer as respectively illustrated by FIGS. 7B and 7C. These processes may be as discussed above in conjunction with FIGS. 2H and 2I.

Source metallization 114, drain metallization 115, and/or a gate metallization may then be formed, resulting in VCDFET 600.

Figure 8:
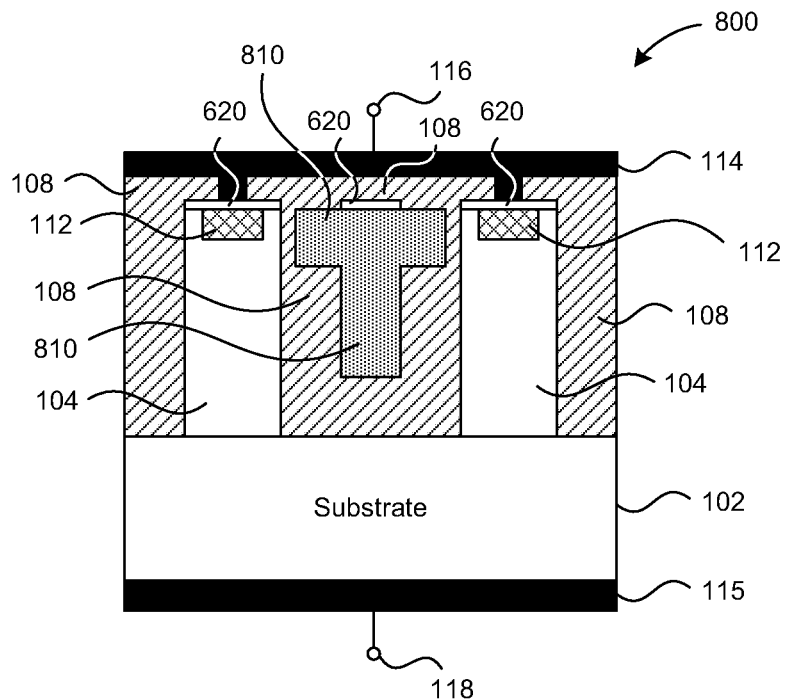
FIGS. 8-11 are cross-sectional views of other embodiments of VCDFETs.

FIG. 8 is a cross-sectional view of VCDFET 800 in which laterally extended gate region 810 is extended laterally and reaches closer to drift regions 104 than gate region 110 of VCDFET 600. As compared to VCDFET 600, VCDFET 800 may have a lower pinch-off voltage due to the reduced distance between laterally extended gate region 810 and drift regions 104 through insulator 108.

As illustrated, laterally extended gate region 810 is somewhat T-shaped in cross-section. For example, laterally extended gate region 810 may include an upper portion and a lower portion, wherein the upper portion is spaced apart from the drift region by a first distance and the second portion is spaced apart from the drift region by a second distance. In this example, the first distance may be less than one half of the second distance. As another example, the width of insulator 108 between laterally extended gate region 810 and upper portions of drift regions 104 may be in the range of about 0.05 micron to about 0.5 microns, while the width of insulator 108 along lower portions of drift regions 104 may be in the range of about 0.5 micron to about 4.0 microns. For such an example, the off-state pinch-off voltage may be approximately 10 volts instead of approximately 50 volts for a similar device lacking a laterally extended gate region.

VCDFET 800 may also have silicide 620 on top of drift regions 104, source contact regions 112, and portions of laterally extended gate region 810. However, other VCD-FETS having gate regions of any suitable shape, with or without silicide, may be employed. As other examples, V-shaped gate regions, other linear or non-linear tapered gate regions, and/or the like may be employed. In addition, profiles of laterally extended gate region 810 or other gate regions may also be matched to profiles of source metallization 114 and/or drift regions 104. In such examples, the pinch-off voltage of the VCDFET may be further reduced while a relatively uniform electric field is maintained along most of the height of the drift regions.

Figure 9:
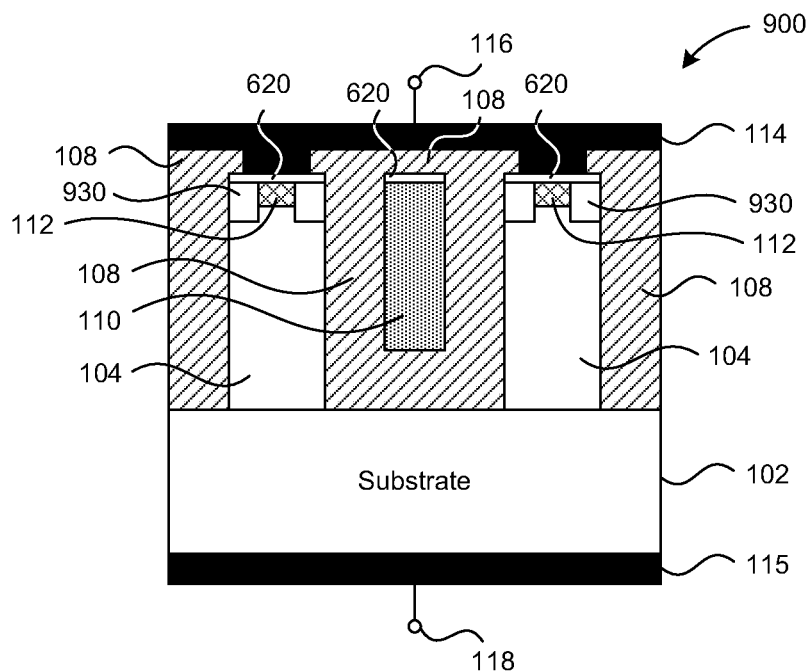

FIG. 9 is a cross-sectional view of VCDFET 900 in which implants 930 are employed in conjunction with drift regions 104 and source contact regions 112. In one embodiment, implants 930 may be P-type implant regions around N+ source contact regions. For example, such P-type implant regions and N-type drift regions may form PN junctions. In this example, when a voltage is applied to an N+ drain and thus coupled to the drift regions, the PN junctions are reverse biased and cause depletion regions to spread from the PN junctions into the drift regions. The depletion regions formed by the PN junctions may aid depletion caused by the capacitive action of gate region 110, thus lowering a pinch-off voltage of VCDFET 900.

Implants 930 may be formed by any suitable implantation or other process and may be formed before or after formation of source contact regions 112. Implants 930 may also be formed via either masked or unmasked processes. Although shown as pairs of implant regions, in some embodiments, a single implant may be employed for each source contact region and may be, for example, an annular implant.

Figure 10:
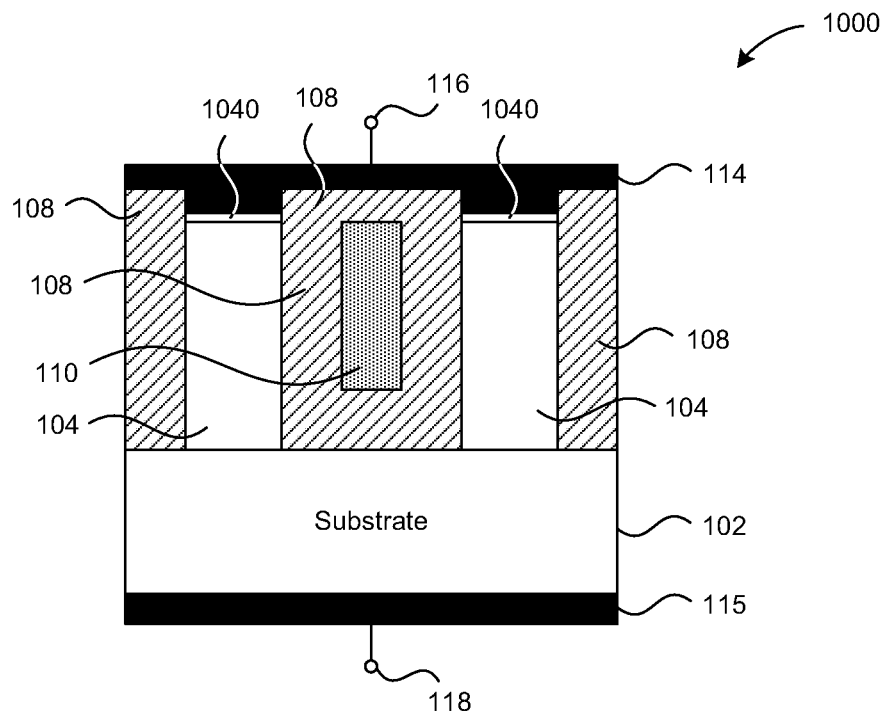

FIG. 10 is a cross-sectional view of VCDFET 1000 in which Schottky contacts are employed instead of doped semiconductor source contact regions. As one example, Schottky contacts may be employed to provide rectifying connections to drift regions 104 instead of ohmic connections. In these examples, use of Schottky contacts may provide asymmetric voltage blocking for VCDFET 1000. For example, Schottky contacts may block off-state current flow between drain electrode 118 and source electrode 116 whereas ohmic connections would not block such flow. However, Schottky contacts may also add a forward voltage characteristic to on-state VCDFET performance. In the embodiment of FIG. 10, the Schottky contact is provided by source metallization 114, e.g. aluminum, or by barrier metal 1040, e.g. titanium or titanium nitride, that may be included under metalization 114. In one embodiment, the Schottky contacts may be formed of a material different than that of the source contact region.

Figure 11:
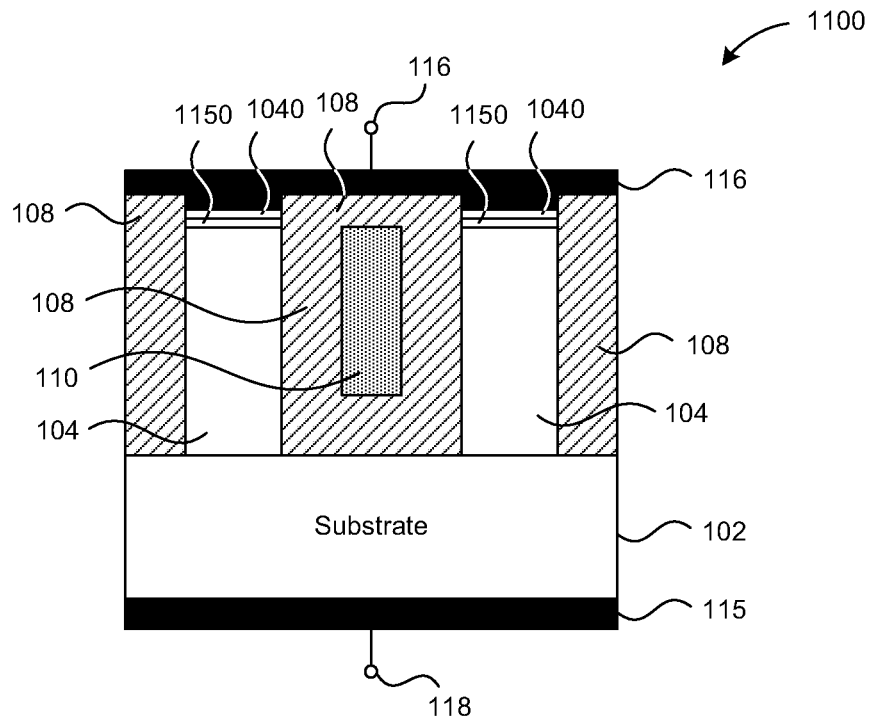

FIG. 11 is a cross-sectional view of VCDFET 1100 in which an enhanced Schottky contact structure is employed. VCDFET 1100 includes an additional metallization layer 1150 in addition to barrier metal 1040. In one embodiment, the use of a dedicated Schottky contact layer may advantageously provide improved junction contact characteristics as compared to VCDFETs having barrier metal Schottky contacts. Schottky layer 1150 may include titanium, titanium nitride, titanium silicide, cobalt, cobalt silicide, platinum, platinum silicide, other suitable metals, alloys or combinations thereof, and/or the like.

While the above Detailed Description describes certain embodiments of the invention, and describes the best mode contemplated, no matter how detailed the above appears in text, the invention can be practiced in many ways. Details of the system may vary in implementation, while still being encompassed by the invention disclosed herein. For example, the various described features and/or processes may be combined in any suitable combination as other embodiments. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description explicitly defines such terms. Accordingly, the actual scope of the invention encompasses not only the disclosed embodiments, but also all equivalent ways of practicing or implementing the invention under the claims.

I claim:

1. A vertical capacitive depletion field effect transistor, comprising:
   a substrate of an N-type;
   a source electrode;
   a drain electrode coupled to the substrate;
   a drift region of the N-type that is electrically coupled to the substrate and the source electrode to form a direct, unswitched path between the source electrode and the drift region, and is configured to enable a current to flow from the source electrode to the drain electrode;
   an insulator; and
   a gate region that is arranged substantially parallel to the drift region and interleaving with the drift region, and is spaced apart from the drift region, from the source electrode and from the substrate by the insulator, and is configured to capacitively deplete the drift region through the insulator to control the enabled current flow through the drift region.

2. The power device of claim 1, wherein the device is configured such that an upper magnitude of the enabled current is limited based on the depletion of the drift region.

3. The power device of claim 1, wherein the gate region is a doped polysilicon region, and wherein the insulator includes silicon dioxide.

4. The power device of claim 1, wherein the drift region is doped with a graded doping profile and is configured to provide a substantially uniform electric field in the drift region during an off-state of the power device.

5. The power device of claim 1, wherein the drift region is doped with a graded doping profile that includes an increasing dopant concentration approaching the substrate and a decreasing dopant concentration away from the substrate.

6. The power device of claim 1, wherein the drift region is doped with a graded doping profile having a substantially constant dopant concentration from a depth X0 to a depth X1 and an increasing dopant concentration from depth X1 to a depth X2, wherein depth X0 is farther from the substrate than depth X2, and wherein depth X1 is between depth X0 and depth X2.

7. The power device of claim 1, wherein the power device is a normally-on vertical capacitive depletion field effect transistor.

8. The power device of claim 1, further comprising:
   a source contact region configured to provide an ohmic connection between the source electrode and the drift region, wherein the source contact region is formed of an N+ material.

9. The power device of claim 1, further comprising:
   a source contact region formed in the drift region;
   a source metallization that includes the source electrode; and
   a silicide layer formed between, and in contact with, the drift region and the source metallization.

10. The power device of claim 9, further comprising:
    an annular region formed around at least a portion of the source contact region and having a first conductivity type opposite to a second conductivity type of the source contact region.

11. The power device of claim 1, further comprising:
    a metal Schottky contact configured to provide a rectifying connection between the source electrode and the drift region.

12. The power device of claim 1, wherein the drift region and the gate region are collectively configured as one cell of a multi-cell power device.

13. The power device of claim 1, wherein the gate region has a substantially T-shaped cross-section including an upper portion and a lower portion, wherein the upper portion is spaced apart from the drift region by a first distance and the second portion is spaced apart from the drift region by a second distance, and wherein the first distance is less than one half of the second distance.

14. A vertical capacitive depletion field effect transistor (VCDFET), comprising:
    a substrate of an N-type;
    a source electrode;
    a drain electrode coupled to the substrate; and
    a plurality of VCDFET cells, each of the VCDFET cells including:
       a drift region of the N-type that is electrically coupled to the source electrode and to the substrate to form a direct, unswitched path between the source electrode and the drift region, and is configured to enable a current flow from the source electrode to the drain electrode;
       a gate region arranged substantially parallel to, interleaving with, and spaced apart from, the drift region and that is configured to capacitively control the current flow through the drift region; and
       an insulator isolating the gate region from the drift region, from the source electrode and from the substrate.

15. The VCDFET of claim 14, wherein each of the plurality of VCDFET cells further includes:
    a source contact region formed near a top surface of the drift region and that is in electrical contact with the source electrode.

16. The VCDFET of claim 15, wherein each of the drift regions are doped with a doping profile having a substantially constant dopant concentration from a depth X0, which is adjacent the source region, to a depth X1 and an monotonically increasing dopant concentration from depth X1 to a depth X2, which is adjacent the substrate, and wherein depth X1 is between depth X0 and depth X2.

17. The VCDFET of claim 15, wherein each of the plurality of VCDFET cells further includes:
   a silicide layer formed between a source metallization and the source contact region; and
   another silicide layer formed at a top surface of the gate region.

18. The VCDFET of claim 15, wherein each of the plurality of VCDFET cells further includes:
   a P-type implant formed around at least a portion of the source contact region.

19. The VCDFET of claim 14, wherein each of the plurality of VCDFET cells further includes:
   a silicide layer formed between the drift region and a source metallization; and
   another silicide layer formed at a top surface of the gate region.

20. The VCDFET of claim 14, wherein each of the plurality of VCDFET cells further includes:
   a metal Schottky contact configured to connect the source electrode to the drift region.

* * * * *